US011837777B2

(12) United States Patent
Zeng

(10) Patent No.: US 11,837,777 B2
(45) Date of Patent: Dec. 5, 2023

(54) ANTENNA ASSEMBLY AND TERMINAL

(71) Applicant: BEIJING XIAOMI MOBILE SOFTWARE CO., LTD., Beijing (CN)

(72) Inventor: Lun Zeng, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 335 days.

(21) Appl. No.: 17/446,294

(22) Filed: Aug. 28, 2021

(65) Prior Publication Data

US 2022/0209408 A1   Jun. 30, 2022

(30) Foreign Application Priority Data

Dec. 28, 2020   (CN) .......................... 202011580679.8

(51) Int. Cl.
*H05K 1/18* (2006.01)
*H01Q 1/24* (2006.01)

(52) U.S. Cl.
CPC .............. *H01Q 1/243* (2013.01); *H05K 1/181* (2013.01)

(58) Field of Classification Search
CPC ................................ H01Q 1/243; H05K 1/181
See application file for complete search history.

(56) References Cited

U.S. PATENT DOCUMENTS

| 2011/0267783 A1* | 11/2011 | Mutnury | ................ H05K 1/115 174/266 |
| 2012/0313825 A1 | 12/2012 | Kuramoto et al. | |
| 2013/0027167 A1* | 1/2013 | Sano | ...................... H05K 1/182 336/192 |
| 2013/0308282 A1* | 11/2013 | Shin | ..................... H05K 1/0277 361/748 |
| 2015/0061941 A1 | 3/2015 | Hill et al. | |
| 2020/0365972 A1 | 11/2020 | Jeon et al. | |

FOREIGN PATENT DOCUMENTS

| CN | 109378584 A | 2/2019 |
| CN | 208923342 U | 5/2019 |

OTHER PUBLICATIONS

Extended European Search Report in Application No. 21194530.8, dated Feb. 14, 2022.

* cited by examiner

*Primary Examiner* — Krystal Robinson
(74) *Attorney, Agent, or Firm* — SYNCODA LLC; Feng Ma

(57) ABSTRACT

A antenna assembly includes: a first antenna disposed on the first support provided with a first through hole, wherein the first antenna includes a first part disposed on an upper surface of the first support, a second part disposed inside the first through hole, and a third part disposed on a lower surface of the first support; a first connecting plate, an upper surface of which abuts against the third part, and lower surface is attached to an upper surface of the circuit board; a second connecting plate, an upper surface of which is attached to a lower surface of the circuit board; and a second antenna disposed on a middle frame of the terminal and connected to a lower surface of the second connecting plate, the first antenna being connected to a feed point of the second antenna through the first connecting plate and the second connecting plate.

17 Claims, 5 Drawing Sheets

ANTENNA ASSEMBLY AND TERMINAL

CROSS-REFERENCE TO RELATED APPLICATION

This application claims priority to Chinese Patent Application No. 202011580679.8 filed on Dec. 28, 2020, the disclosure of which is hereby incorporated by reference in its entirety.

BACKGROUND

With the popularity of 5G technologies, standby time of a terminal and strength of antenna signals are often the most intuitive experience for users. While making the entire terminal thinner, it is also necessary to satisfy arcing requirements of design aesthetics. In the existing design, the antennas are typically distributed at the bottom of the middle frame of the terminal.

SUMMARY

The present disclosure relates to the field of communication technologies, and more specifically, to an antenna assembly and a terminal.

According to a first aspect of embodiments of the present disclosure, there is provided an antenna assembly disposed in a terminal including a circuit board and a first support, the antenna assembly including: a first antenna disposed on the first support provided with a first through hole, wherein the first antenna includes a first part disposed on an upper surface of the first support, a second part disposed inside the first through hole, and a third part disposed on a lower surface of the first support; a first connecting plate, an upper surface of which abuts against the third part, and lower surface is attached to an upper surface of the circuit board; a second connecting plate, an upper surface of which is attached to a lower surface of the circuit board; and a second antenna disposed on a middle frame of the terminal and connected to a lower surface of the second connecting plate, the first antenna being connected to a feed point of the second antenna through the first connecting plate and the second connecting plate.

In some embodiments, one or more limiting bosses are provided on the third part; and one or more first bumps are provided on the upper surface of the first connecting plate, and the first bumps abut against the third part; wherein projections of the limiting bosses and projections of the first bumps on the same horizontal plane are configured as misaligned with each other.

In some embodiments, a second through hole is further provided on the first support; a third through hole is provided on the circuit board at a position corresponding to the second through hole; and the second through hole is used to set a fixing device that passes through the second through hole and the third through hole to fix the first support, the first connecting plate, and the second connecting plate to the circuit board.

In some embodiments, the first connecting plate is ring-shaped and is disposed around the second through hole; and/or the second connecting plate is ring-shaped and is disposed around the third through hole.

In some embodiments, one or more second bumps are provided on the lower surface of the second connecting plate, and the second bumps are used to abut against the second antenna.

In some embodiments, a plurality of the limiting bosses are evenly distributed around the third part.

According to a second aspect of embodiments of the present disclosure, there is provided a terminal, comprising the antenna assembly according to any one of the aforesaid embodiments.

In some embodiments, the first support is a sound cavity support of the terminal.

In some embodiments, the second antenna is disposed on a bottom edge of a middle frame of the terminal.

It is to be understood that both the foregoing general description and the following detailed description are exemplary and explanatory only and are not restrictive of the present disclosure.

BRIEF DESCRIPTION OF THE DRAWINGS

The accompanying drawings, which are incorporated in and constitute a part of this description, illustrate embodiments consistent with the present disclosure and, together with the description, serve to explain the principles of the present disclosure.

DETAILED DESCRIPTION

Description will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely examples of apparatuses and methods consistent with aspects related to the present disclosure as recited in the appended claims.

With the popularity of 5G technologies, standby time of the terminal and strength of the antenna signal both are the most intuitive experience for users. While making thickness of the entire terminal thinner, it is also necessary to meet arcing requirements of design aesthetics. In a conventional design, the antennas are mainly distributed at the bottom of the middle frame of the terminal.

In this case, more and more antennas will be carried by the middle frame. In the limited space at the bottom of the terminal, effectively connecting the antenna to the bottom middle frame and being able to control its closure has always been a subject that needs to be studied and improved in the mobile phone industry.

Since the bottom of the mobile phone is a gathering area of the main antenna, there will be more and more antennas, an LDS antenna (Laser Direct Structuring, laser forming antenna) connection on the bottom of the middle frame and the sound cavity support is often necessary. The sound cavity support can generally be called SPK-BOX in the design field.

The design scheme in the related technologies is to realize the connection and closure of the middle frame and the LDS antenna by using positive pressure elastic sheets and side elastic clips.

Figure 1:
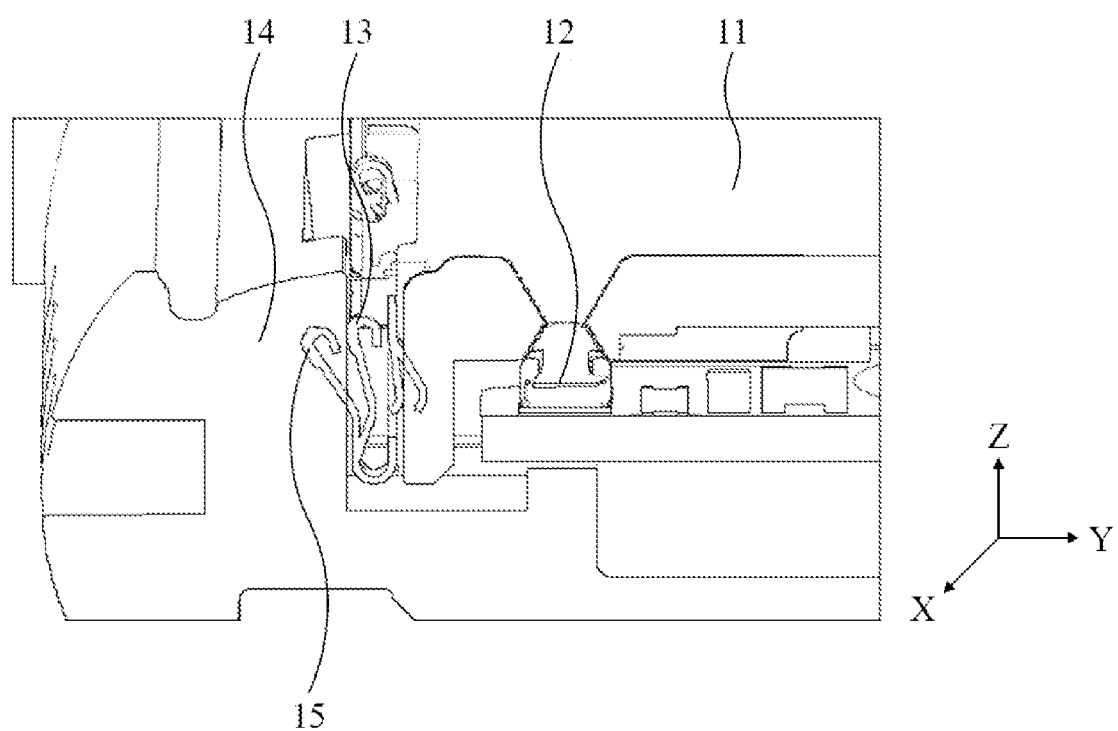
FIG. 1 is a schematic structural diagram of an antenna assembly in some embodiments.

FIG. 1 is a schematic diagram of a structure of an antenna assembly in some embodiments. As shown in FIG. 1, an LDS antenna 11 is connected to the circuit board through a positive pressure elastic sheet 12, and at the same time connected to a feed point 14 at the bottom of the middle frame through a side elastic clip 13, to complete feeding of the LDS antenna 11.

Both the positive pressure elastic sheet 12 and the side elastic clip 13 are elastic sheets with elastic deformation. After the SPK-BOX and the middle frame are assembled, the positive pressure elastic sheet 12 undergoes elastic deformation and generates an interaction force with respect to the circuit board, so as to ensure an effective connection between the positive pressure elastic sheet 12 and the circuit board.

Because the minimum working height of the positive pressure sheet 12 needs to be 0.65 mm and above. In the arrangement of the terminal, a certain space in the Z direction is required for arranging the positive pressure elastic sheet 12, that is, it is difficult to reduce thickness of the terminal. The Z direction can be the thickness direction of the terminal.

Before the middle frame is assembled with the SPK-BOX, a movable end of the side elastic clip 13 is located at a first position 15. Before the middle frame is assembled with the SPK-BOX, the side elastic clip 13 is compressed, undergoes elastic deformation and generates an interaction force with respect to the feed point 14, so as to ensure an effective connection between the positive pressure elastic sheet 12 and the feed point 14.

Since the side elastic clip requires a space of 3.2 mm and above in the X direction and a space of 1.5 mm and above in the Y direction, there are certain requirements for the size of the terminal in both the X direction and the Y direction, which makes the terminal unable to be further reduced in the X and Y directions. It is not conducive to lightness and thinness of the terminal product.

Such an arrangement has certain requirements on the space of the terminal in the X, Y, and Z directions, which greatly limits stacking of products and affects battery capacity and thickness of the whole machine.

Moreover, the side elastic clip 13 is often damaged and deformed during assembly of the SPK-BOX. In the past mass production projects, the side elastic clip often has unstable contact, which affects the product yield to a certain extent.

Figure 2:
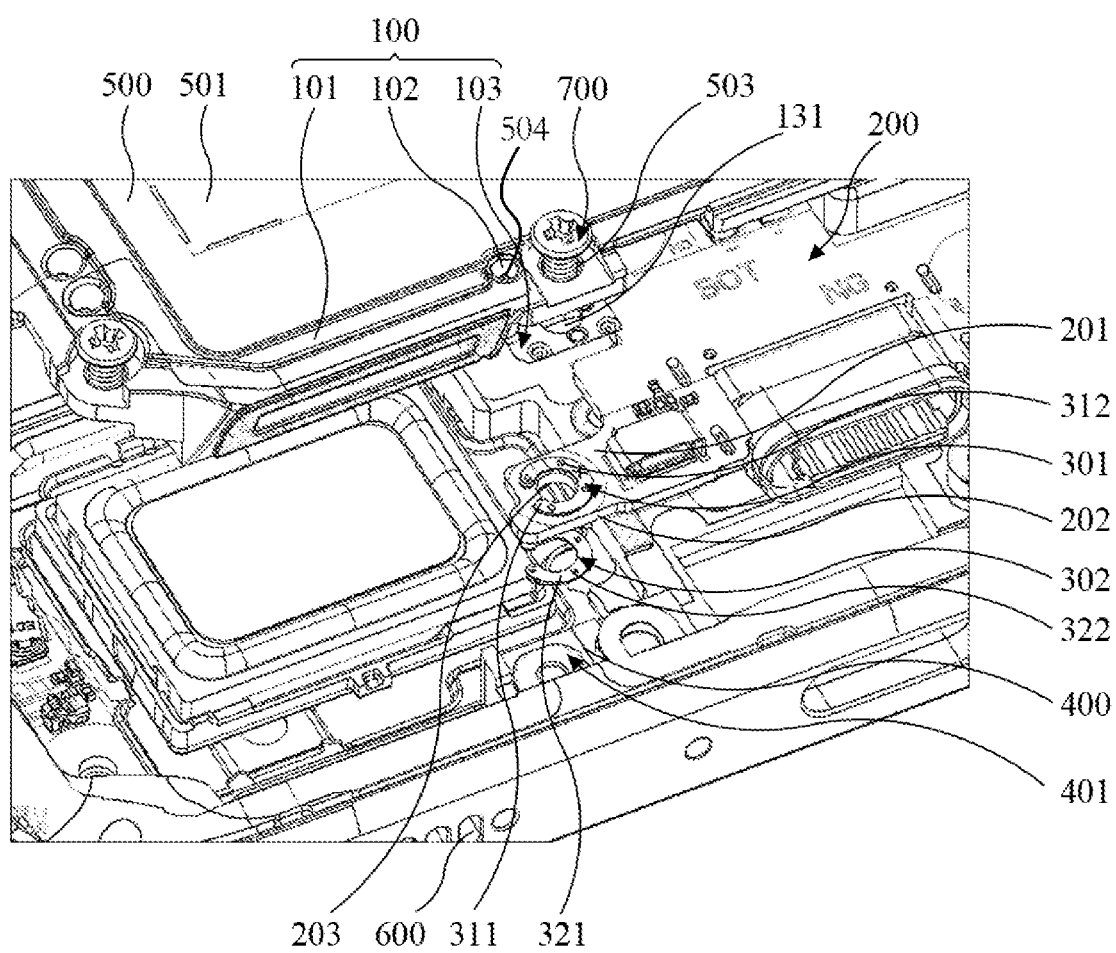
FIG. 2 is an exploded diagram showing a structure of an antenna assembly according to some embodiments.

Based on the above technical problems, the present disclosure provides an antenna assembly, which is beneficial to save internal space of the terminal. FIG. 2 is an exploded diagram showing a structure of an antenna assembly according to some embodiments, as shown in FIG. 2, the antenna assembly of the present disclosure can be installed in a terminal, and includes a first antenna 100, a first connecting plate 301, a second connecting plates 302 and a second antenna.

In the present disclosure, the first antenna 100 is disposed on the first support 500 that is provided with a first through hole 504. Herein, the first antenna 100 includes a first part 101 disposed on an upper surface 501 of the first support 500, a second part 102 disposed inside the first through hole 504, and a third part 103 disposed on a lower surface of the first support 500.

In the present disclosure, the first antenna 100 can be an LDS antenna. The LDS antenna is a technique that uses laser direct structuring technique. The circuit pattern can be activated in a few seconds by means of controlling movement of the laser by the computer according to a trajectory of the conductive pattern to project the laser onto the molded three-dimensional plastic device. During terminal antenna design and production, on the formed support, the metal antenna module can be formed by electroless plating directly on the support using laser technique. Using such a technique, the antenna can be lasered directly on the housing of the terminal.

In the present disclosure, the first antenna 100 can be formed by directly disposing the LDS antenna on the first support 500 by using laser forming technique. The first support 500 can be a component inside the terminal, for example, it can be a sound cavity support, which can also be called an SPK-BOX in practical applications.

Generally, the antennas are mainly distributed at the bottom of the terminal, and speakers are also disposed at the bottom of the terminal, and SPK-BOX can usually be adopted to dispose the speakers. Since the position of the speaker is close to the antenna, the present disclosure uses the SPK-BOX as a support for disposing the antenna. Such an arrangement can effectively utilize the existing components inside the terminal and save the space of the terminal.

In the present disclosure, an upper surface 311 of the first connecting plate abuts against the third part 103. A lower surface of the first connecting plate 301 is attached to an upper surface 201 of the circuit board of the terminal. The first connecting plate 301 is disposed on the upper surface 201 of the circuit board and can be electrically coupled to the circuit board 200, for example, a circuit or the like can be provided between the first connecting plate 301 and the circuit board 200.

The circuit board 200 of the present disclosure can be a small board inside the terminal. A switch element can be disposed between the first connecting plate 301 and the small board, and a power management chip on the small board is used to control turn-on and turn-off of the switch element. In this way, switching of the antenna path and the frequency band can be implemented.

Figure 3:
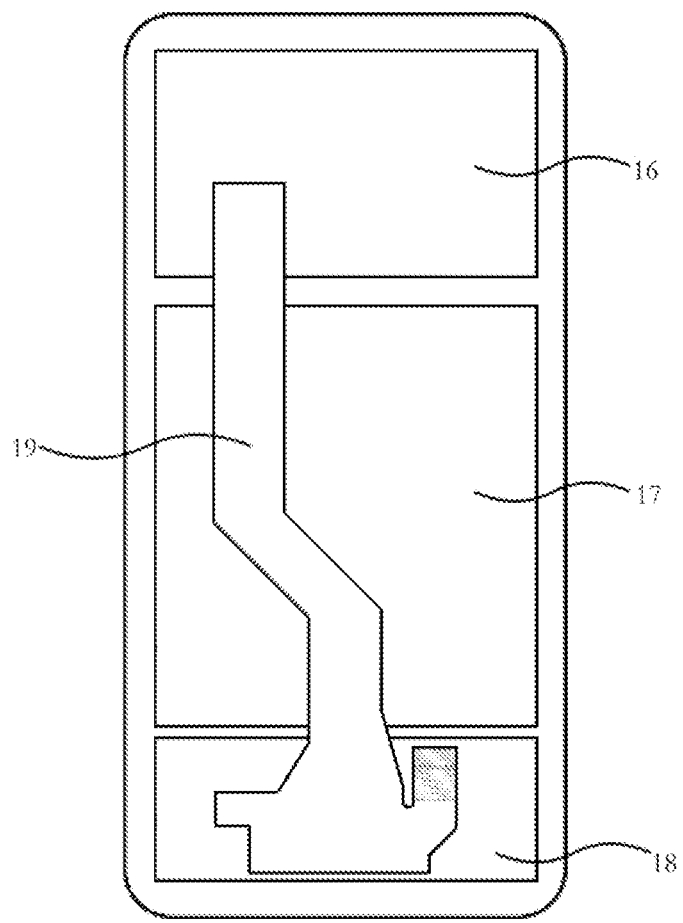
FIG. 3 is a schematic diagram showing a structure of a terminal according to some embodiments.

FIG. 3 is a schematic diagram showing a structure of a terminal according to some embodiments, as shown in FIG. 3, at present, in a terminal such as a mobile phone, the terminal device 10 is divided into three parts, the top area is provided with a main board 16, the middle area is provided with a battery 17, and the bottom is provided with a small board (not shown). There are a charging interface, a data interface, etc. on the small board. The battery 17 is connected to the main board 16, and thus the main board 16 and the small board need to be connected through a communication flexible circuit board (link-FPC). At the same time, the display 18 and the main board 16 also need to be connected through a driving flexible circuit board (LCM_FPC). In order to reduce cost, in some techniques, link_FPC and LCM_FPC are combined into one, a flexible circuit board 19 is used to connect the main board 16 with the display screen 18, and the main board 16 with the small board, respectively. The flexible circuit board 19 is integrated on the back of the display screen 18, not only that the cost is reduced, but also the assembly process of whole machine is reduced.

In the present disclosure, an upper surface 321 of the second connecting plate is attached to a lower surface 202 of the circuit board to abut against the feed point 401 of the second antenna. The first connecting plate 301 is disposed on the upper surface 201 of the circuit board and can be electrically coupled to the circuit board 200, for example, a circuit or the like may be provided between the first connecting plate 301 and the circuit board 200.

The circuit board 200 of the present disclosure can be a small board inside the terminal. A switch element can be disposed between the second connecting plate 302 and the small board, and the power management chip on the small board is used to control the turn-on and turn-off of the switch element. In this way, the switching of the antenna path and the frequency band can be implemented.

By switching the antenna path and the frequency band, the terminal of the present disclosure can receive antenna signals of multiple frequency bands, which is beneficial to adapt to requirements of terminal frequency band in the 5G era. For example, the Ministry of Industry and Information Technology announced the operator's 5G test frequency, China Mobile has allocated with N41 and N79 frequency bands, China Unicom has N78 frequency bands, China Telecom has N78 frequency bands, all Netcom mobile phones cover the N41, N78, and N79 frequency bands, and certainty of the number of 5G frequency bands has increased.

In the arrangement of the present disclosure, the SPK-BOX existing in the terminal is used as a support for disposing the antenna, without adding extra components, and the space inside the terminal is effectively used. An increase of the volume of the terminal is avoided while increasing the applicable frequency band of the terminal antenna.

In the antenna assembly of the present disclosure, the first antenna 100 is introduced into the lower surface from the upper surface of the first support 500 through the first through hole 504, and the connection of the first antenna 100 with the feed point is completed by using the first connecting plate 301 and the second connecting plate 302. Such an arrangement is beneficial to save space in the terminal that is not used for disposing the antenna, thereby making the terminal further lighter and thinner, and improving competitiveness of the terminal.

Moreover, in the arrangement of the present disclosure, only the space in the Z direction of the terminal needs to be used. It avoids occupying the space in the X and Y directions of the terminal, which facilitates lightness and thinness of the terminal.

Figure 4:
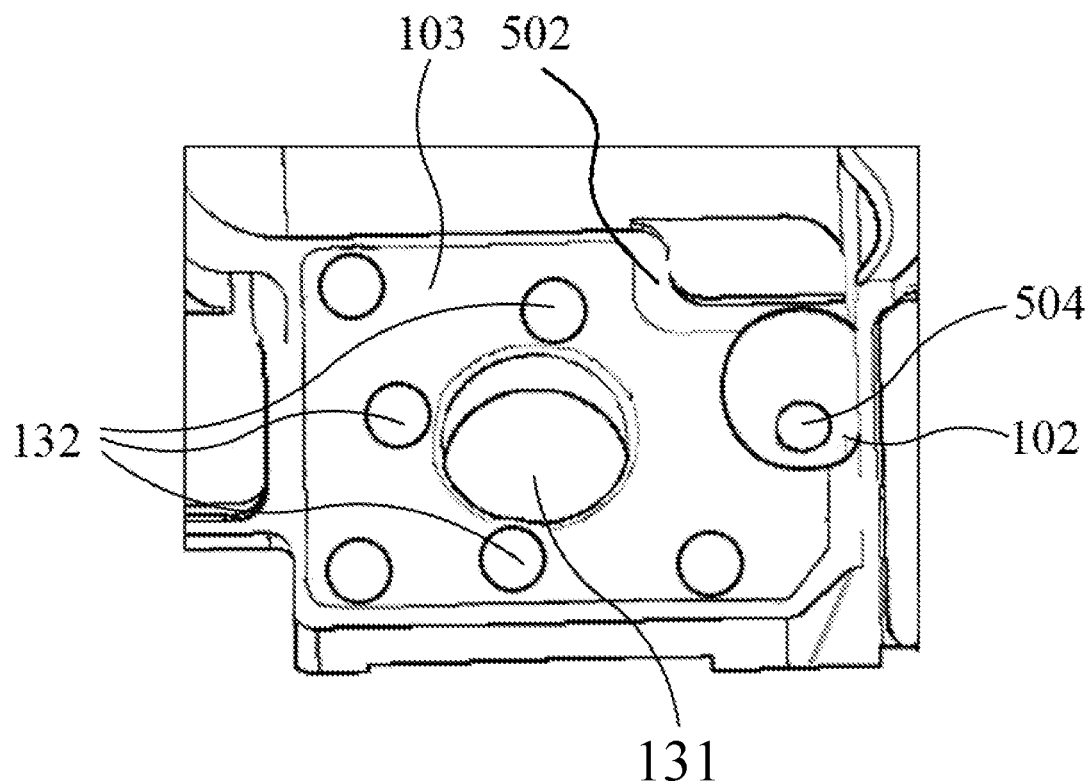
FIG. 4 is a schematic diagram showing a lower surface of a support according to some embodiments.

The terminal further includes a support 500, FIG. 4 is a schematic diagram showing a structure of a lower surface of a support according to some embodiments, as shown in FIG. 4, the first support 500 is provided with a second through hole 503 and a first through hole 504.

In the present disclosure, both the second through hole 503 and the first through hole 504 on the first support 500 can be provided by using existing through holes on the first support 500. Generally, the first support 500 is used as a component of the terminal, and usually needs to be connected and fixed with other components, for example, it can be fixed by a component such as a screw or a positioning post.

Therefore, it is necessary to provide, on the support, a plurality of through holes for setting a component for fixing the support such as a screw or a positioning post. The present disclosure can use these existing through holes to dispose the LDS antenna, and introduce the LDS antenna from the upper surface of the support via the through hole into the lower surface of the support.

Such an arrangement makes the finally formed antenna have three parts, the first part is on the upper surface of the support, which can be the first part 101 in the present disclosure. The second part is located inside the through hole of the support, and can be the second part 102 in the present disclosure. The third part is located on the lower surface of the support, and can be the third part 103 in the present disclosure.

It should be noted that the first part 101, the second part 102, and the third part 103 in the present disclosure are not limited to independent, different antennas, but can be the same continuous antenna, the first, second and third are only used to distinguish the disposed positions of the antenna.

The present disclosure uses the existing through holes on the support to dispose the antenna thereby the space inside the terminal is effectively utilized. A part of the antenna is introduced into the lower surface of the support such that while the antenna is disposed, it is also beneficial to the connection between the antenna and the circuit board 200 located under the support.

It should be noted that the lower surface 502 of the support of the present disclosure can also become a BOSS end surface in actual applications. Such an arrangement does not require separate through holes, an elastic plate is provided to connect the antenna to the circuit board, thereby the space inside the terminal is saved, and production steps of the terminal is reduced.

Figure 5:
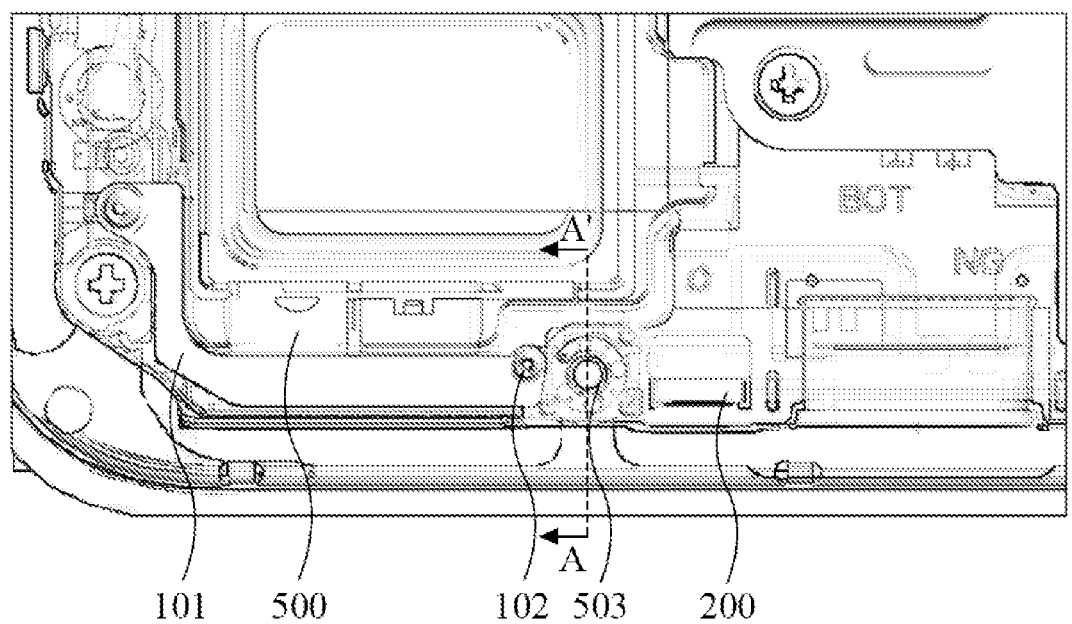
FIG. 5 is a schematic diagram from a top view of a structure of an antenna assembly according to some embodiments.

In some embodiments of the present disclosure, as shown in FIG. 4, the third part 103 is provided with a fourth through hole 131. As shown in FIG. 4, the third part is provided with limiting bosses 132 around the fourth through hole 131. FIG. 5 is a schematic diagram from a top view of a structure of an antenna assembly according to some embodiments, and FIG. 6 is a schematic diagram from a cross-section of a structure of an antenna assembly according to some embodiments.

Figure 6:
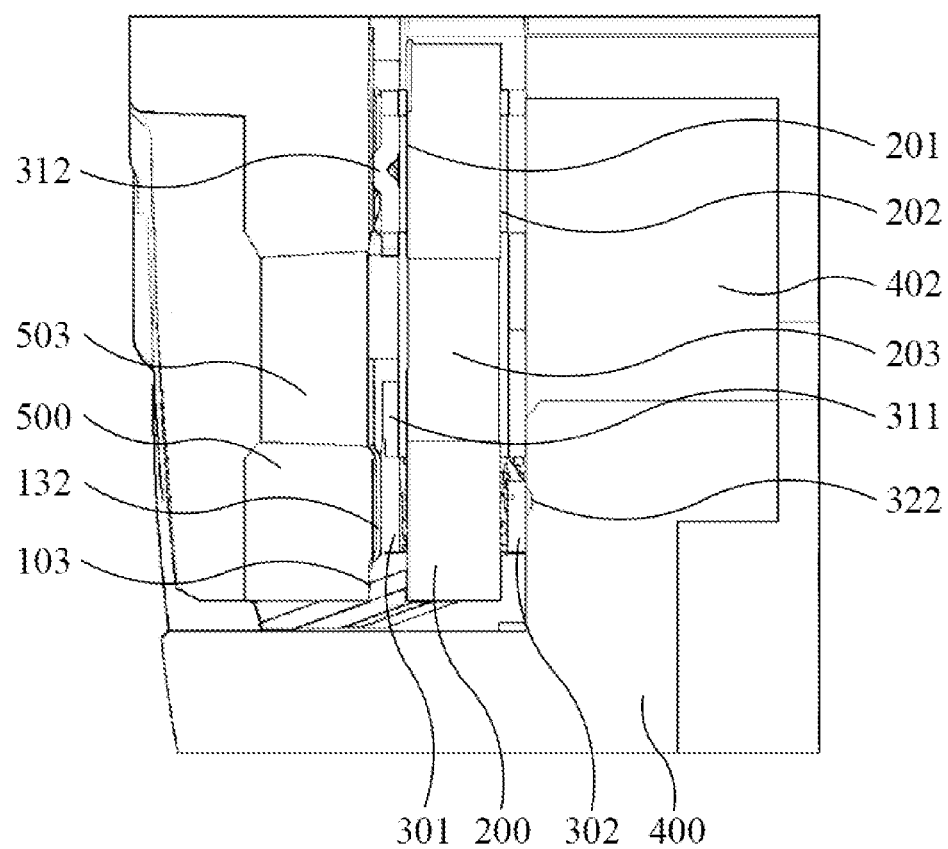
FIG. 6 is a schematic diagram from a cross-section of a structure of an antenna assembly according to some embodiments.

It should be noted that FIG. 6 is a schematic cross-sectional structure diagram of the A-A' part in FIG. 5, as shown in FIG. 5 and FIG. 6, the position corresponding to the second through hole 503 on the circuit board 200 is provided with a third through hole 203.

As shown in FIG. 2, the fourth through hole 131 is used to dispose a fixing device 700, which passes through the fourth through hole 131 and the third through hole 203 to fix the third part 103 to the circuit board 200.

As mentioned above, the first support 500 is provided with a plurality of through holes for fixing the first support 500 to other components by a fixing device such as a screw or a fixing post. It can be known that through holes can also be provided at corresponding positions on other components for setting the fixing device.

For example, when the support is fixed to the circuit board, the corresponding positions of the support and the circuit board should be provided with through holes of similar size.

In the present disclosure, the second through hole 503 on the first support 500 is used to allow the fixing device 700 to pass through, accordingly, a third through hole 203 is provided at a corresponding position on the circuit board 200 under the support.

In some embodiments of the present disclosure, the feed point 401 of the second antenna can be disposed in the middle frame 400 of the terminal. For example, the feed point 401 of the second antenna can be disposed around the fifth through hole 402.

The middle frame 400 is disposed under the circuit board 200, a fifth through hole 402 is disposed on the middle frame 400 at a position corresponding to the third through hole 203. The feed point 401 of the second antenna can be disposed around the fifth through hole 402.

In the present disclosure, the feed point 401 of the second antenna is disposed at the bottom edge of the middle frame 400. In the present disclosure, the bottom edge of the middle frame is relative to the sides of the middle frame. For example, if the terminal is rectangular, the sides of the middle frame can refer to the frames in the thickness direction of the terminal. Correspondingly, the bottom edge of the middle frame can be a plane that is vertical to the side edges.

In the present disclosure, the feed point 401 of the second antenna is arranged at the bottom of the middle frame, so that the first antenna can complete the feed point in the Z direction of the terminal without occupying the space in the X and Y directions, and it facilitates the thin and light design of the terminal.

That is, in the present disclosure, the third part 103 is disposed under the first support 500. In addition, the fourth through hole 131 on the third part 103 corresponds to the second through hole 503 on the first support 500, and the fixing device 700 can pass through the fourth through hole 131 and the second through hole 503 in sequence.

In the present disclosure, the circuit board 200 is disposed under the third part 103. A third through hole 203 is provided on the circuit board 200 at a position corresponding to the fourth through hole 131 and the second through hole 503, and the fixing device 700 can pass through the fourth through hole 131, the second through hole 503 and the second through hole in sequence, so as to fix the first support 500, the third part 103 provided on the first support 500, and the circuit board 200.

Such an arrangement uses the original fixing device 700 in the terminal to fix the first support 500, the third part 103 provided on the first support 500, and the circuit board 200. That is, the purpose of fixing multiple components can also be achieved even if no extra components are added.

In some embodiments of the present disclosure, the first connecting plate 301 can be ring-shaped and disposed around the fourth through hole 131. As shown in FIG. 1 and FIG. 6, the upper surface 311 of the first connecting plate is provided with one or more first bumps 312. The first bumps 312 abut against the third part 103.

In the present disclosure, the first bump 312 is provided on the first connecting plate 301, which facilitates the connection between the first connecting plate 301 and the third part 103. A plurality of first bumps 312 can be provided on the first connecting plate 301, and the plurality of first bumps 312 can be evenly distributed on the first connecting plate 301, which can further ensure the connection between the first connecting plate 301 and the third part 103.

In some embodiments of the present disclosure, the second connecting plate 302 can be ring-shaped and disposed around the third through hole 203. As shown in FIG. 1 and FIG. 6, one or more second bumps 322 are provided on the lower surface of the second connecting plate. The second bump 322 is used to abut against the feed point 401 of the second antenna.

In the present disclosure, the second bump 322 is provided on the second connecting plate 302, which facilitates the connection between the second connecting plate 302 and the feed point 401 of the second antenna. A plurality of second bumps 322 can be provided on the second connecting plate 302, the plurality of second bumps 322 can be evenly distributed on the second connecting plate 302, which can further ensure the connection between the second connecting plate 302 and the feed point 401 of the second antenna.

Such an arrangement not only connects the first support 500, the third part 103 provided on the first support 500, and the circuit board 200, but also can fasten the first connecting plate 301 and the second connecting plate 302. It is ensured that the first connecting plate 301 is fixed to the connection between the third part 103 and the upper surface 201 of the circuit board.

In addition, it can also be ensured that the second connecting plate 302 is fixed to the connection between the lower surface 202 of the circuit board and the feed point 401 of the second antenna. Such an arrangement is beneficial to stabilize the first connecting plate 301 and the second connecting plate 302 so as to stably connect the antenna to the feed point. Therefore, when the terminal undergoes violent movement during use, it will not cause the antenna and the feed point to separate, which affects the use of the terminal.

As mentioned above, in the present disclosure, the fixing device 700 passes through the second through hole 503, the fourth through hole 131, the third through hole 203 and the fifth through hole 402 in sequence, so as to fix the first support 500, the first antenna 100, the circuit board 200 and the middle frame 400. That is, the purpose of fixing multiple components can also be achieved even if no extra components are added.

In the present disclosure, the first connecting plate 301 can be an annular elastic plate, and the height of the annular elastic plate can be, for example, between 0.1 mm and 0.5 mm. The second connecting plate 302 can be an annular elastic plate, and the height of the annular elastic plate can be, for example, between 0.1 mm and 0.5 mm.

In the present disclosure, the used ring-shaped elastic plates can be elastic plates without elastic deformation, which can further save the space in the Z direction inside the terminal. It is beneficial to reduce thickness of the terminal and realize lightness and thinness of the terminal.

In the present disclosure, as shown in FIG. 6, the third part 103 is provided with one or more limiting bosses 132, and the projections of the limiting bosses 132 and the first bumps 312 on the same horizontal plane are configured to be misaligned with each other. That is, when the third part 103 is in contact with the first connecting plate 301, there is no front contact between the limiting bosses 132 and the first bumps 312, but they are misaligned with each other.

In the present disclosure, the height of the limiting bosses 132 can be lower than the height of the first bumps 312, for example, the height of the limiting bosses 132 can be between 0.02 mm and 0.15 mm. The limiting bosses 132 can also be circular, for example, the diameter of the limiting bosses 132 can be between 0.3 mm and 0.8 mm.

In the present disclosure, three limiting bosses 132 can be provided. In some embodiments, the three limiting bosses 132 can be evenly distributed around the third part 103. In other embodiments, the three limiting bosses 132 can be distributed around the third part 103 in the form of isosceles triangles.

Since the terminal can undergo violent movement during use, the first bumps 312 have the risk of causing damage to the third part 103 of the first antenna 100 when the terminal is violently moving.

The arrangement of the limiting bosses 132 can be used as a limiting boss, that is, it prevents the force between the third part 103 and the first connecting plate 301 from being too large in the Z direction, which results in that the first bosses 312 cause damage to the third part 103 of the first antenna 100.

Such an arrangement can improve quality of the terminal and increase competitiveness of the terminal.

In some embodiments of the present disclosure, a plurality of limiting bosses 132 can be provided, and the plurality of limiting bosses 132 can be evenly distributed around the lower end of the fourth through hole 131.

The plurality of limiting bosses 132 can further increase the limiting ability of the limiting bosses 132, the arrangement of which is used as a limiting boss, and can prevent the first boss 312 from damaging the third part 103 at multiple positions. The plurality of limiting bosses 132 are evenly disposed around the fourth through hole 131, which can form a more stable structure.

It should be noted that since the LDS antenna is formed by way of laser forming, the LDS antenna can also be referred to as LDS electroless plating layer in the actual manufacturing process.

According to the arrangement of the present disclosure, in order to save the Z-direction space inside the terminal to the greatest extent during the design of a terminal, researchers choose a ring-shaped elastic sheet with a working height of 0.25 mm.

Because there is no elastic deformation margin, this puts forward a test for the reliability of the LDS electroless plating layer. In order to prevent the ring-shaped elastic sheet bumps from damaging the LDS electroless plating layer during the fall of the whole machine, the researchers have added three limiting bosses at the BOSS end surface of SPK-BOX. After many trials and verifications, the limiting boss with a diameter of 0.55 mm and a height of 0.05 mm can effectively prevent the problem of damage to the electroless plating layer. The verification is effective after many trial productions.

Based on the similar concept, the embodiments of the present disclosure further provide a terminal, and the terminal includes an antenna assembly as in any one of the foregoing embodiments.

In some embodiments of the present disclosure, the support is a sound cavity support of the terminal. In the present disclosure, the first antenna 100 can be formed by directly disposing the LDS antenna on the first support 500 by using laser forming technique. The first support 500 can be a component inside the terminal, for example, it can be a sound cavity support, which can also be called an SPK-BOX in practical applications.

A speaker can be provided on the sound cavity support, a sound hole 600 can be provided at a corresponding position on the speaker and the housing of the terminal, and the sound of the terminal is transmitted to the outside of the terminal through the sound hole 600.

Generally, the antennas are mainly distributed at the bottom of the terminal, and speakers are also disposed at the bottom of the terminal, and SPK-BOX can usually be adopted to dispose the speakers. Due to proximity of the speaker and the antenna, the present disclosure uses the SPK-BOX as a support for disposing the antenna. Such an arrangement can effectively utilize the existing components inside the terminal and save the space of the terminal.

In some embodiments of the present disclosure, the feed point is arranged in the middle frame of the terminal.

In some embodiments of the present disclosure, a second through hole is provided at a position corresponding to the first through hole on the circuit board of the terminal; the middle frame is disposed under the circuit board, a corresponding position at the middle frame is provided with a fifth through hole, and the feed point is disposed around the fifth through hole; the terminal further includes a fixing device, which passes through the third through hole, the first through hole, the second through hole and the fifth through hole in sequence, so as to fix the support, the antenna, the circuit board and the middle frame.

That is, in the present disclosure, the third part 103 is provided on the lower surface of the first support 500. In addition, the fourth through hole 131 on the third part 103 corresponds to the second through hole 503 on the first support 500, and the fixing device 700 can pass through the fourth through hole 131 and the second through hole 503 in sequence.

In the present disclosure, the circuit board 200 is disposed under the third part 103. A third through hole 203 is provided on the circuit board 200 at a position corresponding to the fourth through hole 131 and the second through hole 503, and the fixing device 700 can pass through the fourth through hole 131, the second through hole 503 and the second through hole 503 in sequence, so as to fix the first support 500, the third part 103 provided on the first support 500 and the circuit board 200.

Such an arrangement uses the original fixing device 700 in the terminal to fix the first support 500, the third part 103 provided on the first support 500, and the circuit board 200. That is, the purpose of fixing multiple components can also be achieved even if no extra components are added.

In the experiments of the researchers, the arrangement of the present disclosure is to introduce the LDS antenna to the end surface of the plastic BOSS, attach one ring elastic sheet on each surface of the TOP and BOT surfaces of the small board PCB, and connect the LDS antenna to the middle frame by screws, so as to save space in the X and Y directions, and at the same time save space of more than 0.4 mm in the Z direction.

The arrangement of the present disclosure can adapt to more bottom antenna requirements, and can effectively solve the space bottleneck problem. Through experiments, at least 3.2 mm, 1.5 mm, and 0.4 mm spaces are saved in the X, Y, and Z directions respectively as compared with the traditional scheme, which gives the whole machine stacking great flexibility, thereby enhancing the competitiveness of the product.

Various embodiments of the present disclosure can effectively improve stability of the antenna contact and improve yield of the product.

Various embodiments of the present disclosure successfully solves multiple requirements of antennas, acoustics, ID aesthetics, and structural reliability in the limit of space, and contributes to the achievement of the project, and helps the product to enhance overall competitiveness.

It can be understood that in order to achieve the above functions, the antenna assembly and the terminal provided by the embodiments of the present disclosure include a hardware structure and/or a software module corresponding to each function. With reference to the units and algorithm steps of each example disclosed in the embodiments of the present disclosure, the embodiments of the present disclosure can be implemented in the form of hardware or a combination of hardware and computer software. Whether a certain function is performed by hardware or computer software-driven hardware depends on the specific application and design constraints of the technical solutions. Those skilled in the art can use different methods to implement the described functions for each specific application, but such implementation should not be considered to go beyond the scope of the technical solutions of the embodiments of the present disclosure.

Various embodiments of the present disclosure can have one or more of the following advantages.

The antenna assembly of the present disclosure uses the first support inherent to the terminal, and the first support is provided with a first through hole, such that the first antenna extends from the upper surface of the first support to the lower surface of the first support. Furthermore, the first antenna is connected with a feeding point of the second antenna by using the first connecting plate and the second connecting plate arranged under the first support, that is, the feeding point of the first antenna is completed in the vertical direction, so as to avoid occupying spaces in multiple directions of the terminal. Such an arrangement is beneficial to save the space in the terminal, which is not used for disposing the antenna, thereby making the terminal further light and thin and improving competitiveness of the terminal.

In some embodiments, the first support is an integral part of the terminal.

It can be further understood that "multiple" in the present disclosure refers to two or more, and other quantifiers are similar to it. "And/or", which describes association relationship of associated objects, means that there can be three kinds of relationships, for example, A and/or B can mean that there are three cases: A alone, both A and B, and B alone. The character "/" generally indicates that the associated objects are of an "or" relationship. The singular form "a", "said" and "the" are also intended to include the plural forms unless the context clearly indicates otherwise.

It can be further understood that the terms "first", "second", etc. are used to describe various kinds of information, but the information should not be limited to these terms. These terms are only used to distinguish the same type of information from each other, and do not mean specific order or importance. In fact, the expressions such as "first" and "second" are completely interchangeable. For example, without departing from the scope of the present disclosure, the first information can also be referred to as the second information, similarly, the second information can also be referred to as the first information.

It can be further understood that the terms "center", "longitudinal", "lateral", "front", "rear", "upper", "lower", "left", "right", "vertical", "horizontal", "top", "bottom", "inner" "outer", etc. indicate the orientation or positional relationship based on the orientation or positional relationship shown in the drawings, they are only for the convenience of describing the embodiment and simplifying the description, rather than indicating or implying that the device or element referred to must have a specific orientation, be constructed and operated in a specific orientation.

It can be further understood that unless otherwise specified, "connection" includes a direct connection between the two without other components, and also includes an indirect connection between the two with other elements.

It can be further understood that although the operations in the embodiments of the present disclosure are described in a specific order in the drawings, they should not be understood as that the operations are required to be performed in the specific order shown or in a serial order, or all the operations shown are required to be performed so as to get the desired result. In certain environments, multitasking and parallel processing can be advantageous.

Other embodiments of the present disclosure will be apparent to those skilled in the art from consideration of the description and practice of the present disclosure disclosed here. This application is intended to cover any variations, uses, or adaptations of the present disclosure following the general principles thereof and including such departures from the present disclosure as come within known or customary practice in the art. The description and embodiments are considered as exemplary only, with a true scope and spirit of the present disclosure being indicated by the appended claims.

It will be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims.

What is claimed is:

1. An antenna assembly disposed in a terminal device comprising a circuit board and a first support, the antenna assembly comprising:
   a first antenna disposed on the first support provided with a first through hole, wherein the first antenna comprises a first part disposed on an upper surface of the first support, a second part disposed inside the first through hole, and a third part disposed on a lower surface of the first support;
   a first connecting plate, having an upper surface of which abuts against the third part, and lower surface is attached to an upper surface of the circuit board;
   a second connecting plate, having an upper surface of which is attached to a lower surface of the circuit board; and
   a second antenna disposed on a middle frame of the terminal device and connected to a lower surface of the second connecting plate, the first antenna being connected to a feed point of the second antenna through the first connecting plate and the second connecting plate.

2. The antenna assembly of claim 1, wherein
   one or more limiting bosses are provided on the third part; and
   one or more first bumps are provided on the upper surface of the first connecting plate, and the first bumps abut against the third part;
   wherein projections of the limiting bosses and projections of the first bumps on the same horizontal plane are configured as misaligned with each other.

3. The antenna assembly of claim 2, wherein
   a second through hole is also provided on the first support;
   a third through hole is provided on the circuit board at a position corresponding to the second through hole; and
   the second through hole is used to set a fixing device that passes through the second through hole and the third through hole to fix the first support, the first connecting plate, and the second connecting plate to the circuit board.

4. The antenna assembly of claim 3, wherein
   the first connecting plate is ring-shaped and is disposed around the second through hole; and/or
   the second connecting plate is ring-shaped and is disposed around the third through hole.

5. The antenna assembly of claim 1, wherein
one or more second bumps are provided on the lower surface of the second connecting plate, and the second bumps are used to abut against the second antenna.

6. The antenna assembly of claim 2, wherein the plurality of the limiting bosses are evenly distributed around the third part.

7. A terminal, comprising the antenna assembly according to claim 1.

8. The terminal of claim 7, wherein
the first support is a sound cavity support of the terminal.

9. The terminal of claim 7, wherein
the second antenna is disposed on a bottom edge of a middle frame of the terminal.

10. The terminal of claim 7, wherein
one or more limiting bosses are provided on the third part; and
one or more first bumps are provided on the upper surface of the first connecting plate, and the first bumps abut against the third part;
wherein projections of the limiting bosses and projections of the first bumps on the same horizontal plane are configured as misaligned with each other.

11. The terminal of claim 10, wherein
a second through hole is also provided on the first support;
a third through hole is provided on the circuit board at a position corresponding to the second through hole; and
the second through hole is used to set a fixing device that passes through the second through hole and the third through hole to fix the first support, the first connecting plate, and the second connecting plate to the circuit board.

12. The terminal of claim 11, wherein
the first connecting plate is ring-shaped and is disposed around the second through hole; and/or
the second connecting plate is ring-shaped and is disposed around the third through hole.

13. The terminal of claim 7, wherein
one or more second bumps are provided on the lower surface of the second connecting plate, and the second bumps are used to abut against the second antenna.

14. The terminal of claim 10, wherein
a plurality of the limiting bosses are evenly distributed around the third part.

15. The terminal of claim 7, wherein the first support is an integral part of the terminal.

16. The terminal of claim 15, wherein the feeding point of the first antenna is completed in a vertical direction, so as to avoid occupying spaces in multiple directions of the terminal.

17. The terminal of claim 16, further comprising a display screen.

* * * * *